United States Patent
Ong et al.

(10) Patent No.: US 7,781,564 B2
(45) Date of Patent: *Aug. 24, 2010

(54) POLYTHIOPHENES AND DEVICES THEREOF

(75) Inventors: Beng S. Ong, Mississauga (CA); Ping Liu, Mississauga (CA); Yiliang Wu, Mississauga (CA); Yu Qi, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 177 days.

This patent is subject to a terminal disclaimer.

(21) Appl. No.: 11/565,751

(22) Filed: Dec. 1, 2006

(65) Prior Publication Data

US 2007/0228363 A1    Oct. 4, 2007

Related U.S. Application Data

(62) Division of application No. 10/231,841, filed on Aug. 29, 2002, now Pat. No. 7,256,418, which is a division of application No. 10/042,342, filed on Jan. 11, 2002, now Pat. No. 6,949,762.

(51) Int. Cl.
   *C08G 75/06* (2006.01)
   *H01L 35/24* (2006.01)
   *H01L 51/40* (2006.01)

(52) U.S. Cl. .................. 528/377; 528/373; 257/40; 438/99

(58) Field of Classification Search .................. 528/373, 528/377; 257/40; 438/99
   See application file for complete search history.

(56) References Cited

U.S. PATENT DOCUMENTS 5,069,823 A    12/1991    Sato et al.

(Continued)

FOREIGN PATENT DOCUMENTS

EP    0852403    7/1998

(Continued)

OTHER PUBLICATIONS

Dodabalapur et al., "XP000644686, Organic Transistors: Two-Dimensional Transport and Improved Electrical Characteristics", Science, American Assoc. for the Advancement of Science, vol. 268, Apr. 14, 1995.

(Continued)

*Primary Examiner*—Duc Truong
(74) *Attorney, Agent, or Firm*—Fay Sharpe LLP

(57) ABSTRACT

A polythiophene wherein the monomer segments thereof contain

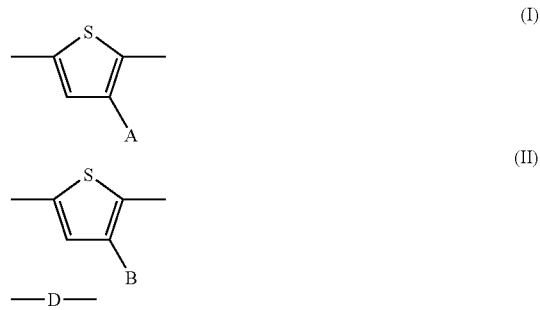

wherein A is a side chain; B is hydrogen or a side chain; and D is a divalent linkage, and wherein the number of A-substituted thienylene units (I) in the monomer segments is from about 1 to about 10, the number of B-substituted thienylene units (II) is from 0 to about 5, and the number of divalent linkages D is 0 or 1.

9 Claims, 2 Drawing Sheets

U.S. PATENT DOCUMENTS

Figure 1:
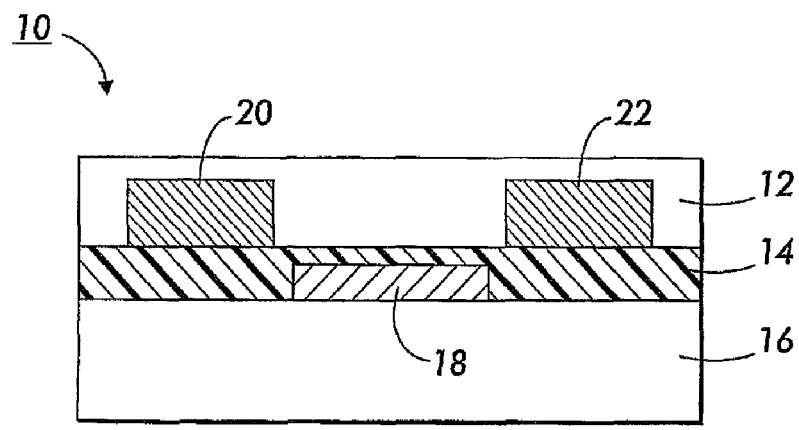

| | | |
|---|---|---|
| 5,347,144 A | 9/1994 | Garnier et al. |
| 5,500,537 A | 3/1996 | Tsumura et al. |
| 5,619,357 A | 4/1997 | Angelopoulos et al. |
| 5,777,070 A | 7/1998 | Inbasekaran et al. |
| 5,969,376 A | 10/1999 | Bao |
| 6,107,117 A | 8/2000 | Bao et al. |
| 6,150,191 A | 11/2000 | Bao |
| 6,232,157 B1 | 5/2001 | Dodabalapur et al. |
| 6,242,561 B1 | 6/2001 | Mohwald et al. |
| 6,320,200 B1 | 11/2001 | Reed et al. |
| 6,429,040 B1 | 8/2002 | Bao et al. |
| 6,445,126 B1 | 9/2002 | Arai et al. |
| 6,506,438 B2 | 1/2003 | Duthaler et al. |
| 6,621,098 B1 | 9/2003 | Jackson et al. |
| 6,621,099 B2 | 9/2003 | Ong et al. |
| 6,770,904 B2 | 8/2004 | Ong et al. |
| 6,806,374 B2 | 10/2004 | Heeney et al. |
| 6,872,801 B2 | 3/2005 | Ong et al. |
| 6,949,762 B2 * | 9/2005 | Ong et al. ............ 257/40 |
| 7,132,500 B2 | 11/2006 | Ong et al. |
| 7,256,418 B2 * | 8/2007 | Ong et al. ............ 257/40 |

FOREIGN PATENT DOCUMENTS

| | | |
|---|---|---|
| EP | 1279689 | 1/2003 |

OTHER PUBLICATIONS

Gundlach et al., "Pentacene Organic Thin Film Transistors—Molecular Ordering and Mobility", IEEE Electron Device Lett., vol. 18, p. 87 (1997).

Garnier et al., "Molecular Engineering of Organic Semiconductors: Design of Self-Assembly Properties in Conjugated Thiophene Oligomers", Amer. Chem. Soc., vol. 115, p. 8716 (1993).

Bao et al., "Soluble and Processable Regioregular Poly(3-Hexylthiophene) for Field-Effect Thin Film Transistor Application with High Mobility", Appl. Phys. Lett., vol. 69, p. 4108 (1996).

Katz et al., "Oligo- and Polythiophene Field Effect Transistors", Handbook of Oligo- and Polythiophenes, Wiley-VCH: Weinheim, Chapter 9, pp. 459-489 (1999).

* cited by examiner

POLYTHIOPHENES AND DEVICES THEREOF

CROSS-REFERENCE TO RELATED APPLICATIONS

This is a divisional of application Ser. No. 10/231,841, filed on Aug. 29, 2002 now U.S. Pat. No. 7,256,418. That application was a divisional of application Ser. No. 10/042,342, filed on Jan. 11, 2002 now U.S. Pat. No. 6,949,762.

Illustrated in commonly owned U.S. Pat. Nos. 6,770,904; 6,621,099; 6,872,801; 7,132,500; and in application Ser. No. 10/042,357, filed Jan. 11, 2002 now U.S. Pat. No. 7,141,644, the disclosures of which are totally incorporated herein by reference, are polythiophenes and devices thereof. The appropriate components, processes thereof and uses thereof illustrated in these copending applications may be selected for the present invention in embodiments thereof.

STATEMENT REGARDING FEDERALLY SPONSORED RESEARCH OR DEVELOPMENT

This invention was made with United States Government support under Cooperative Agreement No. 70NANBOH3033 awarded by the National Institute of Standards and Technology (NIST). The United States Government has certain rights in the invention.

BACKGROUND

The present invention is generally directed to polythiophenes and uses thereof. More specifically, the present invention in embodiments is directed to a class of polythiophenes comprised of monomer segments containing at least two different types of 2,5-thienylene units and an optional divalent moiety, and which polythiophenes are capable of molecular self-organization, providing ordered microstructures in thin films that can be ideal for microelectronic device applications. An example of a polythiophene is one in which certain thienylene moieties contain long side chains, which are arranged in a regioregular manner on the polymer chain, and which can assist to induce and to facilitate molecular organization of the polythiophenes.

Semiconductive polymers like certain polythiophenes, which are useful as active semiconductor materials in thin film transistors (TFTs), have been reported. A number of these polymers have some solubility in organic solvents and are thus able to be fabricated as semiconductor channel layers in TFTs by solution processes, such as spin coating, solution casting, dip coating, screen printing, stamp printing, jet printing and the like. Their ability to be fabricated via common solution processes would render their manufacturing simpler and cost effective as compared to the costly conventional photolithographic processes typical of silicon-based devices such as hydrogenated amorphous silicon TFTs. Moreover, desired are transistors fabricated with polymer materials, such as polythiophenes, referred to as polymer TFTs, with excellent mechanical durability and structural flexibility, which may be highly desirable for fabricating flexible TFTs on plastic substrates. Flexible TFTs would enable the design of electronic devices which usually require structural flexibility and mechanical durability characteristics. The use of plastic substrates together with organic or polymer transistor components can transform the traditionally rigid silicon TFT into a mechanically more durable and structurally flexible polymer TFT design. The latter is of particular value to large area devices such as large area image sensors, electronic paper and other display media. Also, the selection of polymer TFTs for integrated circuit logic elements for low end microelectronics, such as smart cards, radio frequency identification (RFID) tags, and memory/storage devices, may also greatly enhance their mechanical durability, and thus their useful life span. Nonetheless, many of the semiconductor polythiophenes are not, it is believed, stable when exposed to air as they become oxidatively doped by ambient oxygen, resulting in increased conductivity. The result is larger off-current and thus lower current on/off ratio for the devices fabricated from these materials. Accordingly, with many of these materials, rigorous precautions have to be undertaken during materials processing and device fabrication to exclude environmental oxygen to avoid or minimize oxidative doping. These precautionary measures add to the cost of manufacturing therefore offsetting the appeal of certain polymer TFTs as an economical alternative to amorphous silicon technology, particularly for large area devices. These and other disadvantages are avoided or minimized in embodiments of the present invention.

REFERENCES

A number of organic semiconductor materials has been described for use in field-effect TFTs, which materials include organic small molecules such as pentacene, see for example D. J. Gundlach et al., "Pentacene organic thin film transistors—molecular ordering and mobility", *IEEE Electron Device Lett.*, Vol. 18, p. 87 (1997), to oligomers such as sexithiophenes or their variants, see for example reference F. Garnier et al., "Molecular engineering of organic semiconductors: Design of self-assembly properties in conjugated thiophene oligomers", *Amer. Chem. Soc.*, Vol. 115, p. 8716 (1993), and certain polythiophenes, such as poly(3-alkylthiophene), see for example reference Z. Bao et al., "Soluble and processable regioregular poly(3-hexylthiophene) for field-effect thin film transistor application with high mobility", *Appl. Phys. Lett.* Vol. 69, p 4108 (1996). Although organic material based TFTs generally provide lower performance characteristics than their conventional silicon counterparts, such as silicon crystal or polysilicon TFTs, they are nonetheless sufficiently useful for applications in areas where high mobility is not required. These include large area devices, such as image sensors, active matrix liquid crystal displays and low end microelectronics such as smart cards and RFID tags. TFTs fabricated from organic or polymer materials may be functionally and structurally more desirable than conventional silicon technology in the aforementioned areas in that they may offer mechanical durability, structural flexibility, and the potential of being able to be incorporated directly onto the active media of the devices, thus enhancing device compactness for transportability. However, most small molecule or oligomer-based devices rely on difficult vacuum deposition techniques for fabrication. Vacuum deposition is selected primarily because the small molecular materials are either insoluble or their solution processing by spin coating, solution casting, or stamp printing do not generally provide uniform thin films. In addition, vacuum deposition may also involve the difficulty of achieving consistent thin film quality for large area format. Polymer TFTs, such as those fabricated from regioregular polythiophenes of, for example, regioregular poly(3-alkylthiophene-2,5-diyl) by solution processes, while offering reasonably good mobility, suffer from their propensity towards oxidative doping in air. For practical low cost TFT design, it is therefore of value to have a semiconductor material that is both stable and solution processable, and where its performance is not adversely affected by ambient oxygen, for example, regioregular polythiophenes such as poly(3-alkylthiophene-2,5-diyl) are very sensitive to air. The TFTs fabricated from these materials in ambient conditions generally exhibit very large off-current, very low current on/off ratios, and their performance characteristics degrade rapidly.

References that may be of interest include U.S. Pat. Nos. 6,150,191; 6,107,117; 5,969,376; 5,619,357, and 5,777,070.

FIGURES

Illustrated in FIGS. 1 to 4 are various representative embodiments wherein certain polythiophenes are, for example, selected as the channel materials in thin film transistor configurations.

SUMMARY

It is a feature of the present invention to provide semiconductor polymers, such as polythiophenes, which are useful for microelectronic device applications, such as thin film transistor devices.

It is another feature of the present invention to provide polythiophenes which are soluble in common organic coating solvents such as, for example, methylene chloride, tetrahydrofuran, toluene, xylene, mesitylene, chlorobenzene, and the like, and thus can be fabricated by solution processes such as spin coating, screen printing, stamp printing, dip coating, solution casting, jet printing and the like.

Another feature of the present invention resides in providing electronic devices, such as TFTs with a polythiophene channel layer, and which layer has a conductivity of from $10^{-6}$ to about $10^{-9}$ S/cm (Siemens/centimeter).

A further feature of the present invention is to provide polythiophenes which are accessible synthetically, and which polythiophenes possess enhanced resistance to oxidative doping by ambient oxygen.

Also, in yet another feature of the present invention there are provided polythiophenes and devices thereof, and which devices exhibit enhanced resistance to the adverse effects of oxygen, that is, these devices exhibit relatively high current on/off ratios, and their performance does not usually degrade as rapidly as those fabricated from regioregular polythiophenes such as regioregular poly(3-alkylthiophene-3,5-diyl).

Additionally, in a further feature of the present invention there is provided a class of polythiophenes with unique structural features which are conducive to molecular self-alignment under appropriate processing conditions and which structural features also enhance the stability of device performance. Proper molecular alignment can result in higher molecular structural order in thin films, which can be important to efficient charge carrier transport, and thus higher electrical performance.

Aspects of the present invention relate to an electronic device containing a polythiophene derived from a monomer segment containing two 2,5-thienylene segments, (I) and (II), and an optional divalent segment D (I)

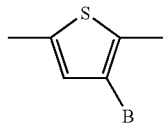

(II)

—D— wherein A is a side chain; B is hydrogen or a side chain; and D is a divalent segment, and wherein the number of A-substituted thienylene units (I) in the monomer segments is from about 1 to about 10, the number of B-substituted thienylene units (II) is from 0 to about 5, and the number of divalent linkages D is 0 or 1; an electronic device wherein A is alkyl containing from about 5 carbon atoms to about 25 carbon atoms; B is alkyl containing from zero to about 4 carbon atoms; and D is an arylene or a dioxyarene, each containing from about 6 to about 40 carbon atoms, or an alkylene or a dioxyalkane, each containing from about 1 to about 20 carbon atoms; an electronic device wherein A is alkyl containing from about 6 to about 15 carbon atoms; B is hydrogen; and D is arylene containing from about 6 to about 24 carbon atoms; an electronic device wherein D is phenylene, tolylene, xylylene, biphenylene, substituted biphenylene, phenanthrenylene, dihydrophenanthrenylene, fluorenylene, dibenzothiophenediyl, dibenzofurandiyl, carbazolediyl, methylene, polymethylene, dialkylmethylene, dioxyalkane, dioxyarene, or oligoethylene oxide; an electronic device wherein A is hexyl, heptyl, octyl, nonyl, decyl, undecyl, dodecyl, tridecyl, tetradecyl, or pentadecyl; B is hydrogen; and D is phenylene, tolylene, xylylene, biphenylene, substituted biphenylene, phenanthrenylene, dihydrophenanthrenylene, fluorenylene, dibenzothiophenediyl, dibenzofurandiyl, carbazolediyl, methylene, polymethylene, dialkylmethylene, dioxyalkane, dioxyarene, or oligoethylene oxide; a thin film transistor device comprised of a substrate, a gate electrode, a gate dielectric layer, a source electrode and a drain electrode, and a semiconductor layer comprised of the polythiophene; a thin film transistor device wherein A is alkyl containing from about 5 carbon atoms to about 25 carbon atoms; B is hydrogen or a short chain alkyl; and D, when present, is arylene or dioxyarene, each containing from about 6 to about 40 carbon atoms, or alkylene or dioxyalkane, each containing from about 1 to about 20 carbon atoms, and wherein the source/drain electrodes and the gate dielectric layer are in contact with the semiconductive layer; a thin film transistor device wherein A is alkyl containing from about 6 to about 15 carbon atoms; B is hydrogen; and D is arylene containing from about 6 to about 30 carbon atoms, and wherein the source/drain electrodes and the gate dielectric layer are in contact with the semiconductive layer; a thin film transistor device wherein D is phenylene, tolylene, xylylene, biphenylene, substituted biphenylene, phenanthrenylene, dihydrophenanthrenylene, fluorenylene, dibenzothiophenediyl, dibenzofurandiyl, carbazolediyl, methylene, polymethylene, dialkylmethylene, dioxyalkane, dioxyarene, or oligoethylene oxide, and wherein the source/drain electrodes and the gate dielectric layer are in contact with the semiconductive layer; a thin film transistor device wherein A is hexyl, heptyl, octyl, nonyl, decyl, undecyl, dodecyl, tridecyl, tetradecyl, or pentadecyl; B is hydrogen; and D is phenylene, tolylene, xylylene, biphenylene, substituted biphenylene, phenanthrenylene, dihydrophenanthrenylene, fluorenylene, dibenzothiophenediyl, dibenzofuran-diyl, carbazolediyl, methylene, polymethylene, dialkylmethylene, dioxyalkane, or dioxyarene, and wherein the source/drain electrodes and the gate dielectric layer are in contact with the semiconductive layer; a thin film transistor device wherein the substrate is a plastic sheet of a polyester, a polycarbonate, or a polyimide, the gate, source, and drain electrodes are each independently comprised of gold, nickel, aluminum, platinum, indium titanium oxide, a conductive polymer, a conductive ink or paste comprising a dispersion of conductive particles in a dispersing medium, and the gate dielectric layer is comprised of silicon nitride, silicon oxide, insulating polymers of a polyester, a polycarbonate, a polyacrylate, a poly(methacrylate), a poly(vinyl phenol), a polystyrene, a polyimide, an epoxy resin, an inorganic-organic composite material of nanosized metal oxide particles dispersed in a polymer, a polyimide, or an epoxy resin; and wherein the source/drain electrodes and the gate dielectric layer are in contact with the semiconductive layer; a thin film transistor device wherein the substrate is glass or a plastic sheet; the gate, source and drain electrodes are each independently comprised of gold; the gate dielectric layer is comprised of an organic polymer of poly(methacrylate), polyacrylate, poly(vinyl phenol), polystyrene, polyimide, polycarbonate, or a polyester, and wherein the source/drain electrodes and the gate dielectric layer are in contact with the semiconductive layer; a thin film transistor device wherein the polythiophene layer is formed by a solution process of spin coating, stamp printing, screen printing, or jet printing, and wherein the source/drain electrodes and the gate dielectric layer are in contact with the semiconductive layer; a thin film transistor device wherein the gate, source and drain electrodes, dielectric, and semiconductor layers are formed from components deposited by solution processes of spin-coating, solution casting, stamp printing, screen printing, and jet printing, and wherein the source/drain electrodes and the gate dielectric layer are in contact with the semiconductive layer; a thin film transistor device wherein the substrate is a plastic sheet of a polyester or a polycarbonate, and the gate, source and drain electrodes are comprised of conductive polymers of polystyrene sulfonate-doped poly(3,4-ethylenedioxythiophene) or a conductive ink or paste of a colloidal dispersion of a metal of silver or gold in a binder, and the gate dielectric layer is an organic polymer or an inorganic oxide particle-polymer composite, and wherein the source/drain electrodes and the gate dielectric layer are in contact with the semiconductive layer; a thin film transistor device comprised of a substrate, a gate electrode, a gate dielectric layer, a source electrode and a drain electrode, and in contact with the source/drain electrodes and the gate dielectric layer, a semiconductor layer comprised of a polythiophene represented by Formula (III)

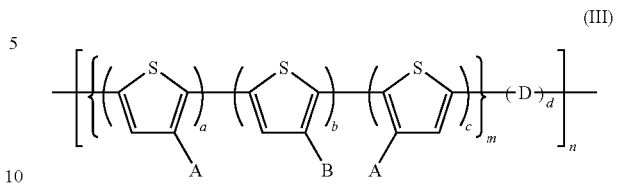

wherein A is a long side chain; B is hydrogen or a short side chain; and D is a divalent linkage; a and c represent the number of A-substituted thienylenes, and are from about 1 to about 6; b is the number of B-substituted thienylene units and is from 0 to about 6; d is 0 or 1; and n is the degree of polymerization or the number of the monomer segments in the polythiophene; a thin film transistor device wherein D is a divalent linkage optionally comprised of a saturated moiety of alkylene, —O—R—O—, —S—R—S—, —NH—R—NH—, where R is alkylene or arylene, or an unsaturated moiety of an arylene or heteroaromatics; a thin film transistor device wherein A is alkyl containing from 6 to about 25 carbon atoms; B is hydrogen or alkyl containing from 1 to about 3 carbon atoms; D is arylene or dioxyarene, each containing from about 6 to about 40 carbon atoms, or alkylene or dioxyalkane, each containing from about 1 to about 20 carbon atoms; a thin film transistor device wherein A is alkyl containing from about 8 to about 12 carbon atoms, and B is a hydrogen atom; a thin film transistor device wherein A is alkyl containing from 5 to about 15 carbon atoms; B is a hydrogen atom; D is arylene; a, b, c, and m are independently selected from the numbers 1, 2, and 3; and d=1; a thin film transistor device wherein A is alkyl containing from about 8 to about 12 carbon atoms; B is a hydrogen atom; D is arylene; a=c=m=1; b=2; and d=1; a thin film transistor device wherein n is from about 5 to about 5,000; a thin film transistor device wherein the number average molecular weight ($M_n$) of (III) is from about 2,000 to about 100,000, and wherein the weight average molecular weight ($M_w$) is from about 4,000 to about 500,000, each as measured by gel permeation chromatography using polystyrene standards; a thin film transistor device wherein the number average molecular weight ($M_n$) of (III) is from about 10,000 to about 30,000 and the weight average molecular weight ($M_w$) is from about 15,000 to about 100,000; a thin film transistor device wherein A is hexyl, heptyl, octyl, nonyl, decyl, undecyl, dodecyl, tridecyl, tetradecyl, or pentyldecyl; a thin film transistor device wherein D is an arylene selected from the group consisting of phenylene, tolylene, xylylene, biphenylene, substituted biphenylene, fluorenylene, phenanthrenylene, dihydrophenanthrenylene, and dibenzofuranediyl, dibenzothiophenediyl, carbazolediyl; a thin film transistor device wherein D is saturated linkage selected from the group consisting of alkylene, dioxyalkane, dioxyarene, and oligoethylene oxide; a thin film transistor device wherein the polythiophene (III) is selected from (1) through (17) wherein n represents the number of repeating segments

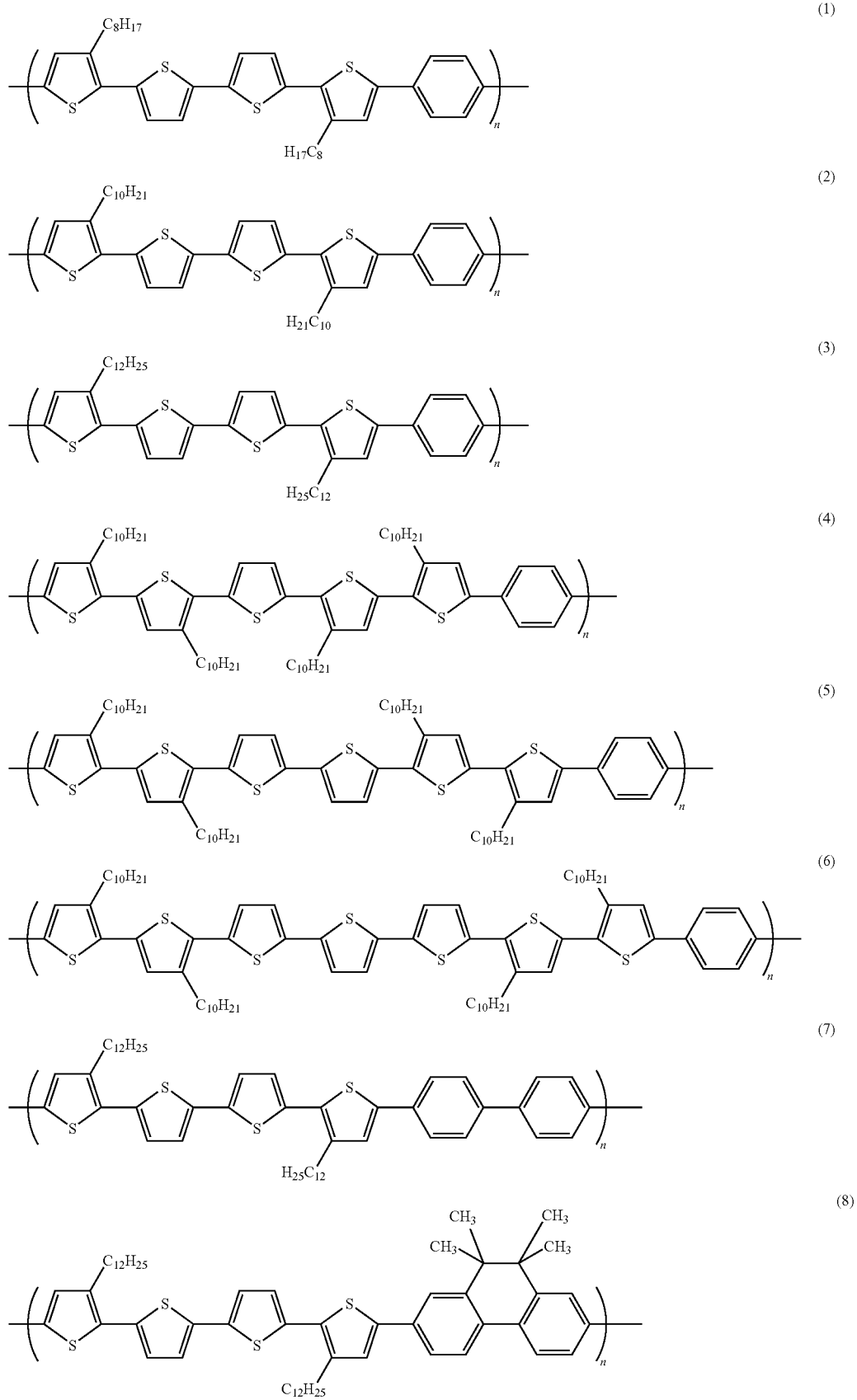

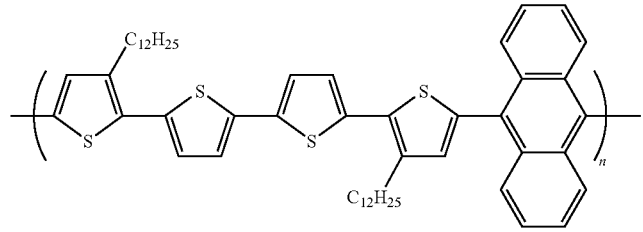
(9)
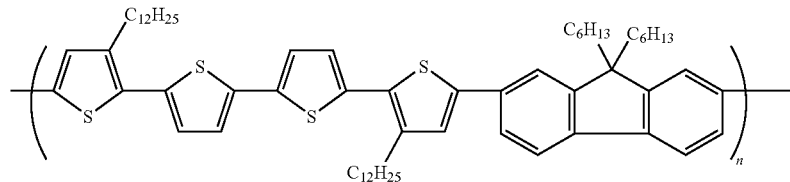
(10)
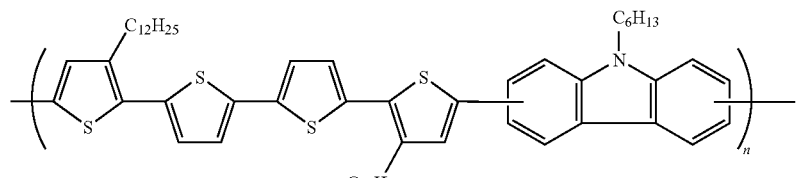
(11)
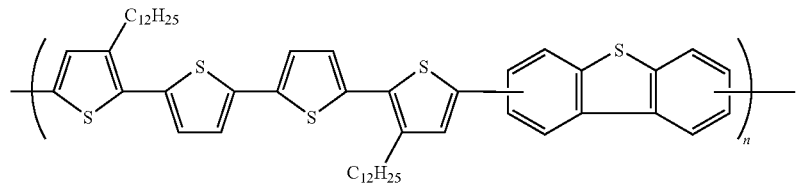
(12)
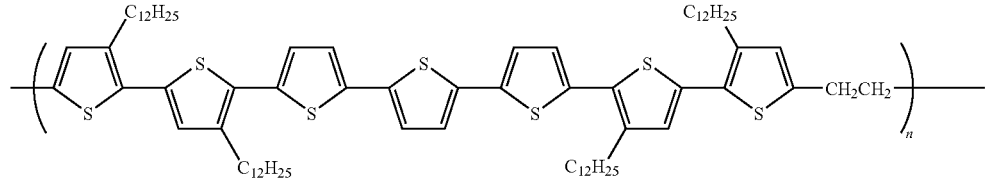
(13)
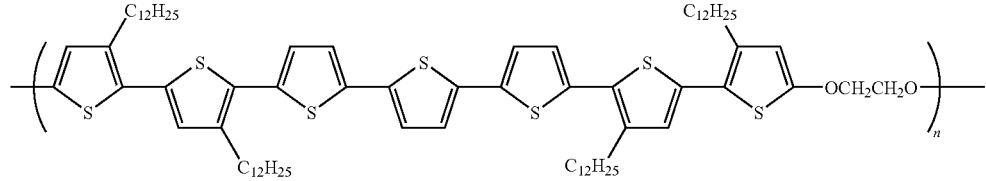
(14)
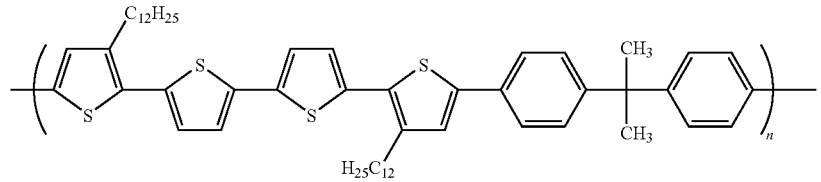
(15)
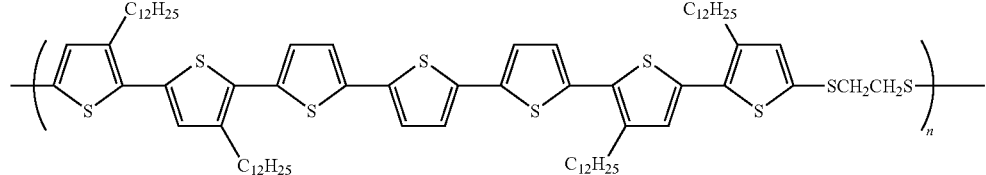
(16)

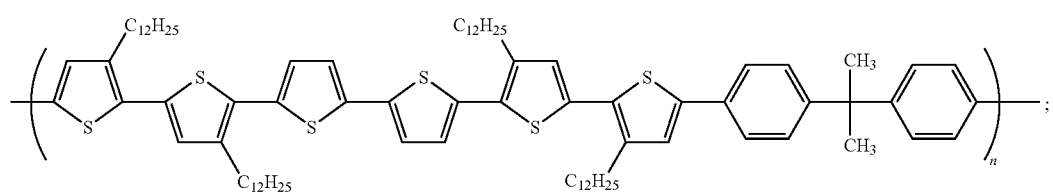
a thin film transistor device wherein polythiophene (III) is alternatively wherein n represents the number of segments
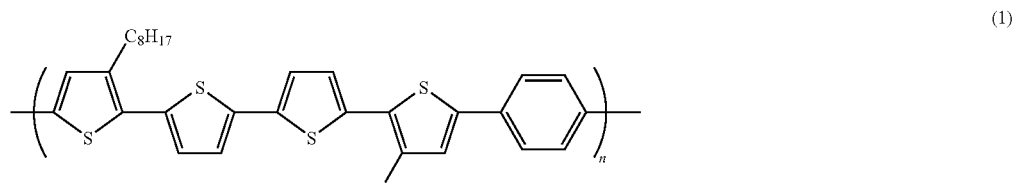
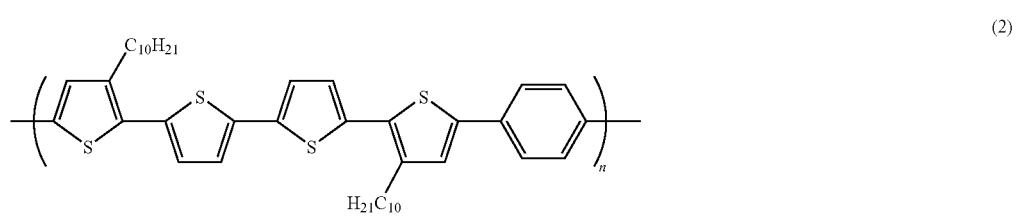
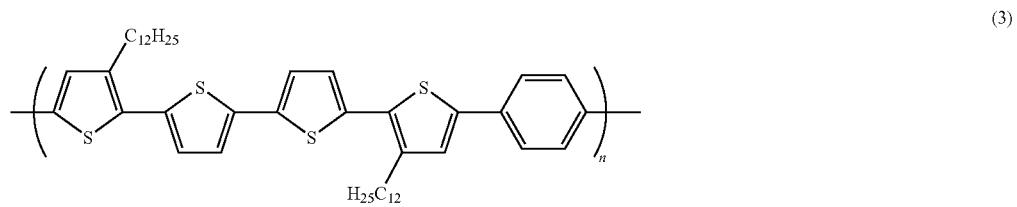
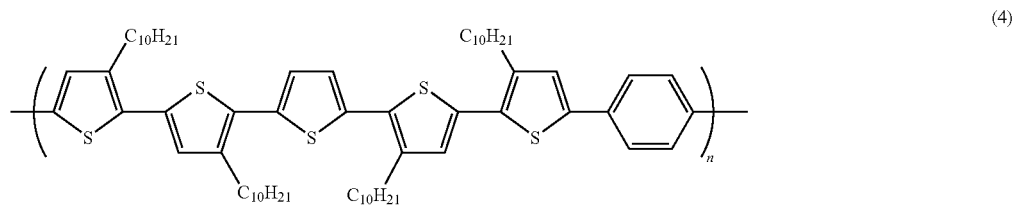
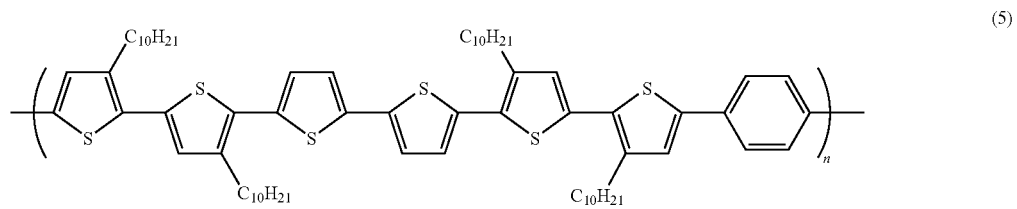
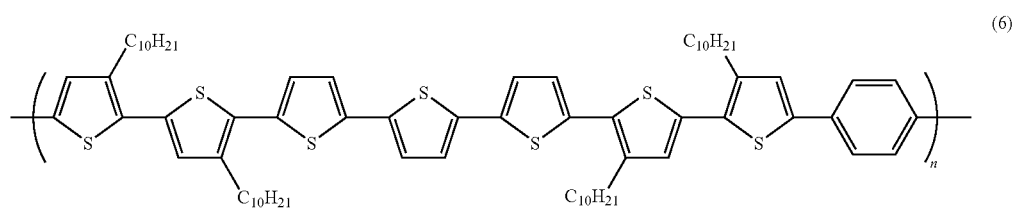

-continued
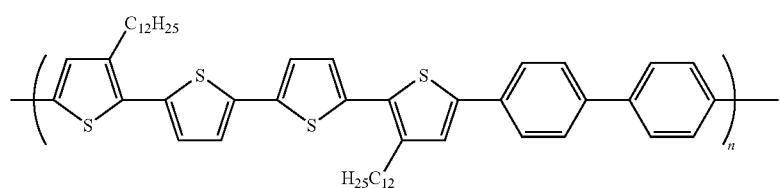
(7)
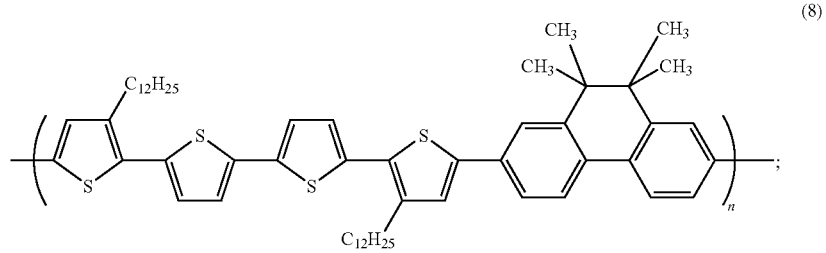
(8)
a thin film transistor device wherein polythiophene (III) is alternatively wherein n represents the number of segments
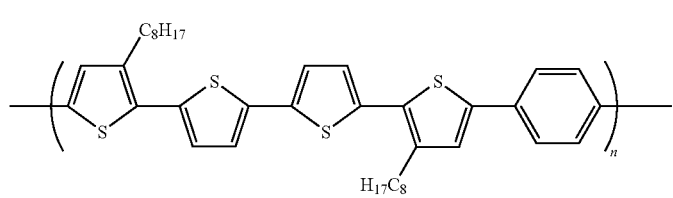
(1)
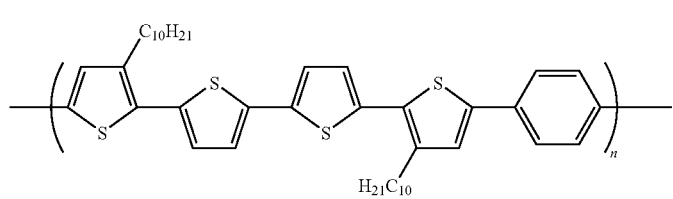
(2)
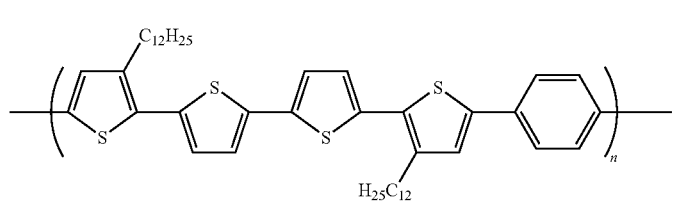
(3)
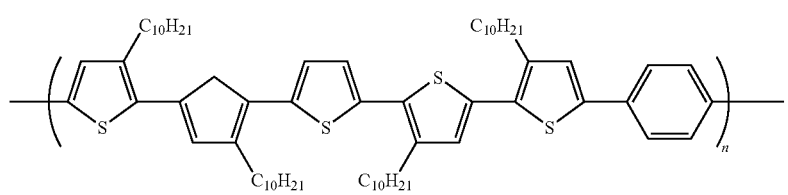
(4)
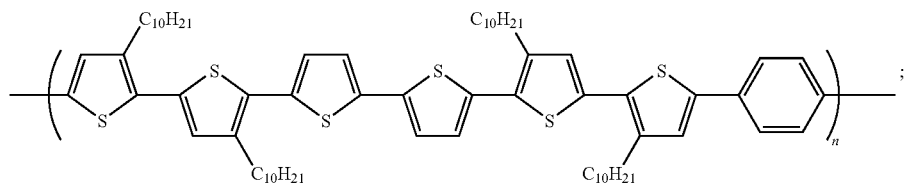
(5)

a thin film transistor device wherein the polythiophene is alternatively

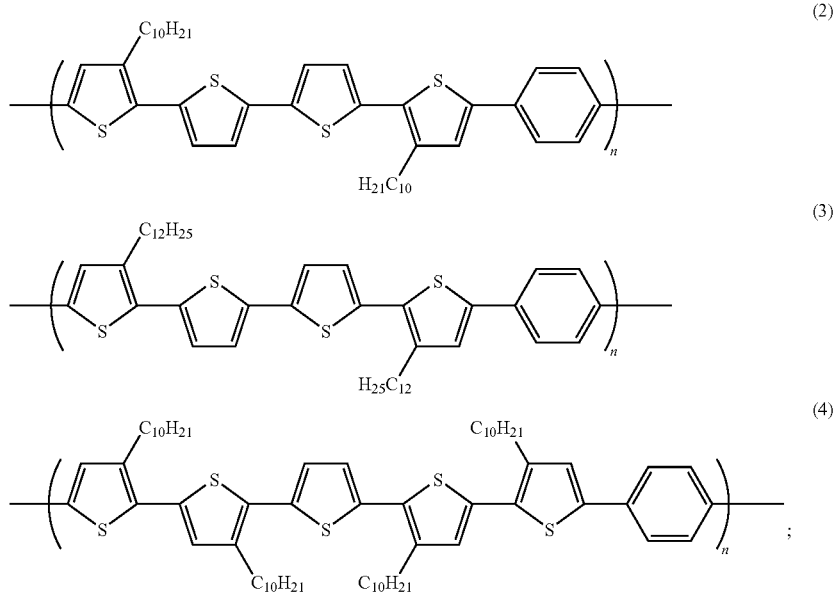

a thin film transistor device wherein the substrate is a plastic sheet of a polyester, a polycarbonate, or a polyimide; the gate, source, and drain electrodes are each independently comprised of gold, nickel, aluminum, platinum, or indium titanium oxide; and the gate dielectric layer is comprised of silicon nitride, silicon oxide, insulating polymers of polyester, polycarbonates, polyacrylate, poly(methacrylate), poly (vinyl phenol), polystyrene, polyimide, or an epoxy resin; a thin film transistor device wherein the substrate is glass or a plastic sheet; the gate, source and drain electrodes are each independently comprised of gold or a metal dispersion in a binder; the gate dielectric layer is comprised of an organic polymer of polyester, polycarbonate, polyacrylate, poly (methacrylate), poly(vinyl phenol), polystyrene, polyimide, or an epoxy resin, or an inorganic-organic composite of nano-sized metal oxide particles dispersed in a polymer of a polyester, a polyimide, or an epoxy resin; a thin film transistor device wherein the thickness of the substrate is from about 10 micrometers to about 10 millimeters; the thickness of the gate dielectric layer is from about 10 nanometers to about 1 micrometer; the thickness of the polythiophene semiconductor layer is from about 10 nanometers to about 1 micrometer; the thickness of the gate electrode layer is from about 10 nanometers to about 10 micrometers; and the thickness of the source or drain electrode is from about 40 nanometers to about 1 micrometer; a thin film transistor device in accordance with claim 16 wherein the polythiophene layer is formed by a solution process of spin coating, stamp or screen printing, or jet printing; a thin film transistor device wherein the electrodes (gate, source and drain), gate dielectric, and semiconductor layers are formed from materials which can be deposited by solution processes such as spin-coating, solution casting, stamp printing, screen printing, and jet printing; a thin film transistor device wherein the substrate is a plastic sheet of polyester, polycarbonate, or polyimide, and the gate, source and drain electrodes are comprised of conductive polymers such as polystyrene sulfonate-doped poly(3,4-ethylenedioxythiophene) or conductive ink or paste of a colloidal dispersion of silver or gold in a polymer binder, and the gate dielectric layer is organic polymer or inorganic oxide particle-polymer composite; a thin film transistor device wherein the thickness of the substrate is from about 10 micrometers to about 10 millimeters, with the preferred thickness being in the range of 50 to 100 micrometers for a flexible plastic substrate and in the range of 1 to 10 millimeters for a rigid substrate such as glass or silicon; the thickness of the gate dielectric layer is from about 10 nanometers to about 1.0 micrometers, with the preferred thickness being in the range of 100 nanometers to 500 nanometers; the thickness of the polythiophene semiconductor layer is generally in the range of 10 nanometers to 1 micrometer with the preferred thickness being in the range of 40 to 100 nanometers; the thickness of the gate electrode layer is in the range of 10 nanometers to 10 micrometers and the preferred thickness is in the range of 10 to 200 nanometers for metal films and in the range of 1 to 10 micrometers for polymer conductors; and the thickness of the source or drain electrode is in the range of 40 nanometers to 1 micrometers with the preferred thickness being in the range of 100 to 400 nanometers; and polythiophenes generated from a monomer segment containing two types of 2,5-thienylene units, (I) and (II) and a divalent linkage, D in suitable proportions

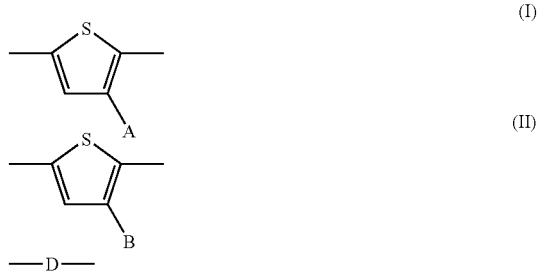

wherein A is a long side chain containing, for example, about 5 to about 25 atoms in length; B is hydrogen atom or a short side chain containing, for example, less than or about 5 carbon atoms in length, and more specifically, from about 1 to about 3 carbon atoms in length; and D is a divalent unit such as a saturated moiety of, for example, methylene, ethylene, propylene, butylene, pentylene and the like, or an unsaturated moiety of, for example, aryl, such as arylene biarylene, fluorenylene, and the like. The number of A-substituted thienylene units (I) in the monomer segments can, for example, be from about 1 to about 10, the number of B-substituted thienylene units (II) can be from 0 to about 5; and the number of divalent segment D can be, for example, 0 or 1.

The polythiophenes of the present invention in embodiments can be illustrated by Formula (III)

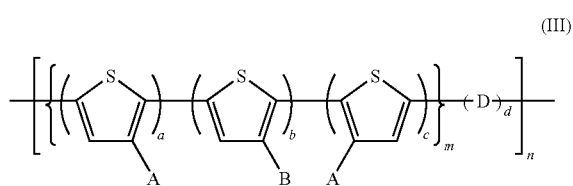
(III)

wherein A is a long side chain containing, for example, 5 to 25 atoms in length; B is hydrogen atom or a short side chain containing, for example 4 or less than about 4 carbon atoms in length; D is a divalent segment, such as saturated moiety, such as an alkylene like methylene, ethylene, propylene, and the like, or an unsaturated moiety like arylene, biarylene, fluorenylene, and the like; a and c are the number of A-substituted thienylenes with a being, for example, from about 1 to about 8 and c being, for example, from 0 to about 8; b is the number of B-substituted thienylene units and can be, for example, from 0 to about 5; d is, for example, 0 or 1; and n is the degree of polymerization or the number of the monomer segments in the polythiophene (III), and can be, for example, from about 5 to over 5,000, and more specifically, from about 10 to about 1,000. The number average molecular weight ($M_n$) of the polythiophenes of the present invention can be, for example, from about 2,000 to about 100,000, and more specifically, from about 4,000 to about 50,000, and their weight average molecular weight ($M_w$) can be from about 4,000 to about 500,000, and more specifically, from about 5,000 to about 100,000 both as measured by gel permeation chromatography using polystyrene standards.

Examples of A include alkyl containing, for example, from about 5 to about 30 carbon atoms, such as pentyl, hexyl, heptyl, octyl, nonyl, decyl, undecyl, dodecyl, tridecyl, tetradecyl, pentyldecyl, and the like, alkoxyalkyl, such as for example methoxybutyl, methoxyhexyl, methoxyhexyl, methoxyheptyl, and the like, a polyether chain, such as polyethylene oxide, perhaloalkyl, such as perfluoroalkyl, a polysiloxy chain, such as a trialkylsiloxyalkyl derivative, and the like; examples of B include hydrogen, halogen or halide, such as chloro, fluoro, or bromo atoms, alkyl like methyl, ethyl, propyl, alkoxy, such as methoxy, ethoxy, propoxy, butoxy and the like. Examples of the divalent linkage D are alkylene, such as methylene, ethylene, dialkylmethylene, propylene, and the like; arylene such as phenylene, biphenylene, phenanthrenylene, dihydrophenanthrenylene, fluorenylene, oligoarylene, and the like; and dioxyalkylene, dioxyarylene, oligoethylene oxide, and the like.

Specific illustrative polythiophenes include the following, and wherein n represents the number of segments

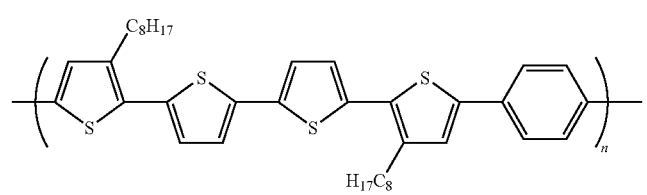
(1)

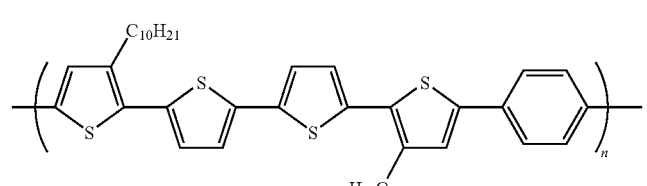
(2)

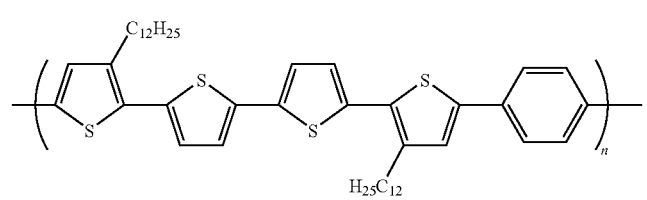
(3)

-continued
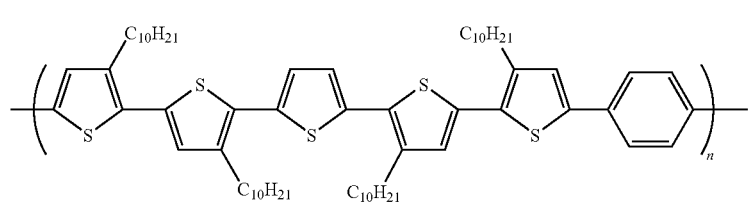
(4)
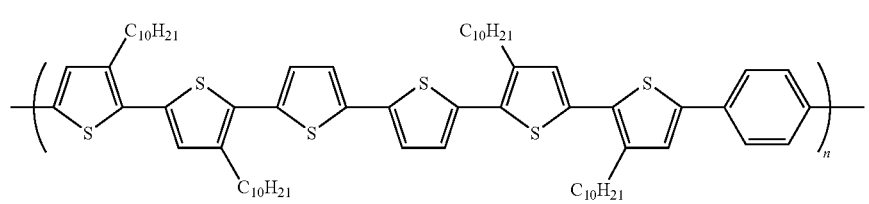
(5)
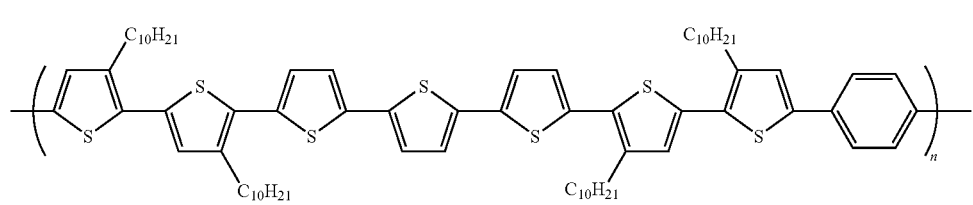
(6)
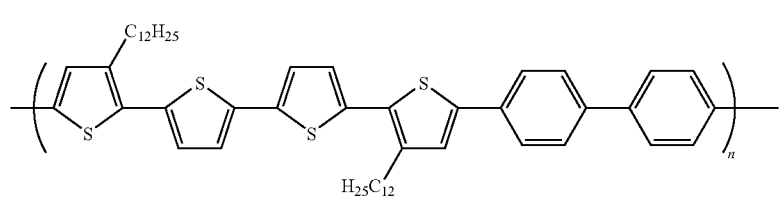
(7)
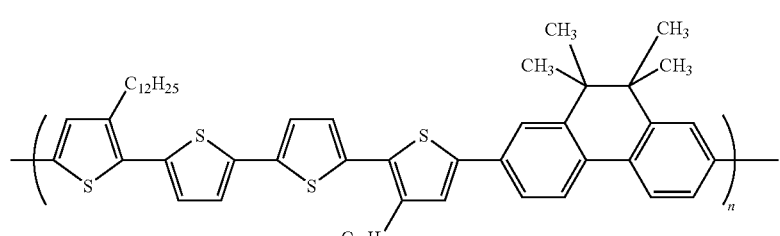
(8)
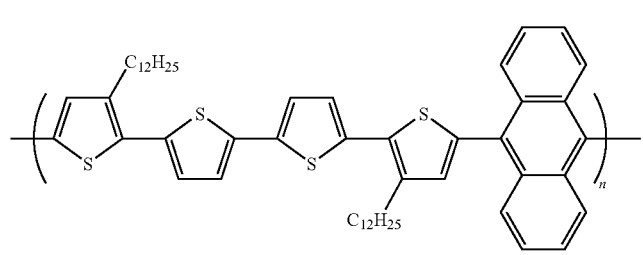
(9)
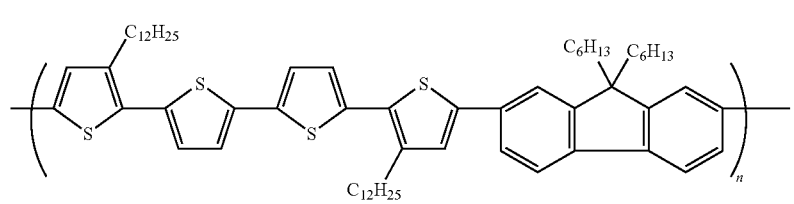
(10)

-continued

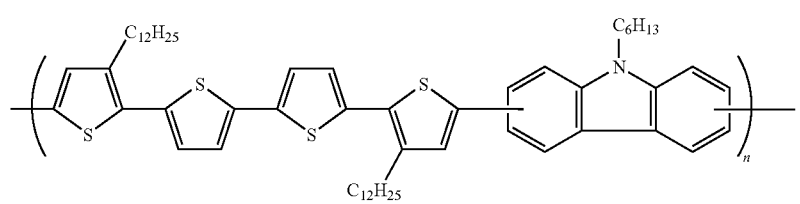
(11)

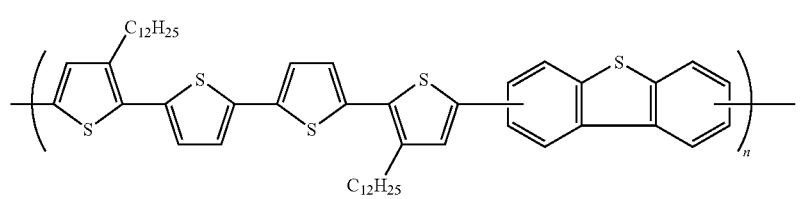
(12)

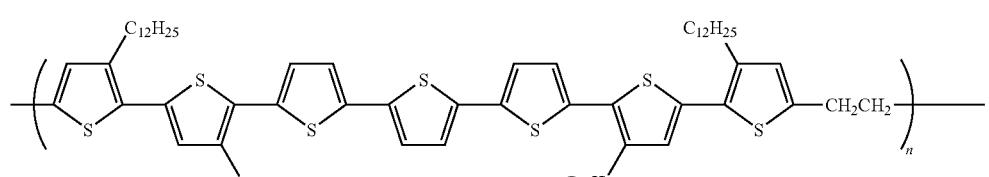
(13)

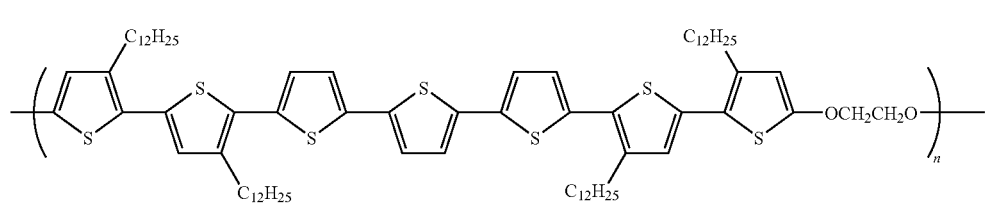
(14)

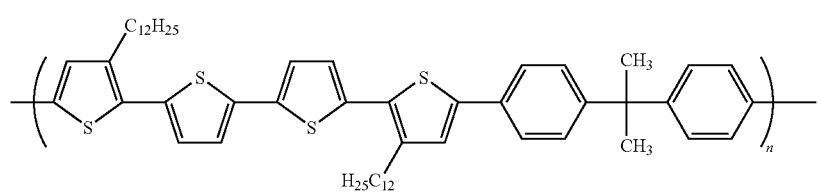
(15)

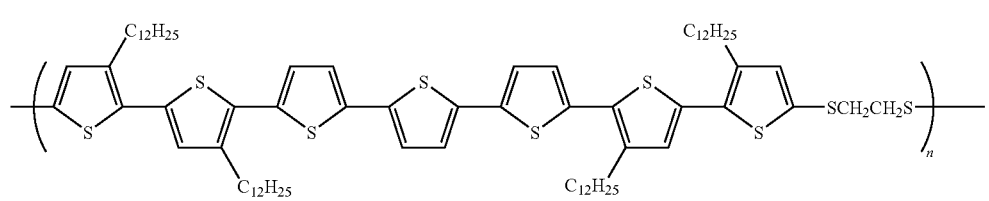
(16)

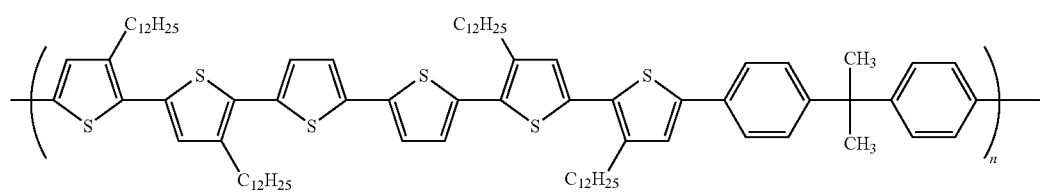
(17)

The polythiophenes of the present invention in embodiments are soluble in common organic coating solvents, for example they possess a solubility of at least about 0.1 percent by weight, and more specifically, from about 0.5 percent to about 5 percent by weight in such solvents as methylene chloride, 1,2-dichloroethane, tetrahydrofuran, toluene, xylene, mesitylene, chlorobenzene, and the like. Moreover, the polythiophenes of the present invention in embodiments when fabricated as semiconductor channel layers in thin film transistor devices provide a stable conductivity of, for example, from about $10^{-9}$ S/cm to about $10^{-6}$ S/cm, and more specifically, from about $10^{-8}$ S/cm to about $10^{-7}$ S/cm as determined by conventional four-probe conductivity measurements.

A number of synthetic procedures are suitable for the preparation of the polythiophenes of the present invention, each depending primarily on the specific polythiophenes desired. For example, polythiophene (V), a member of the polythiophene class represented by general Formula (III) with a=c=d=m=1, B=H, and D=Ar (arylene), can be prepared from the Suzuki coupling reaction of a properly constructed oligothiophene monomer (IVb) with an appropriate arylene-diboronate. Specifically, (IVb) can be obtained from bromination of (IVa), which in turn is obtained from the reaction of 2-bromo-3-alkylthiophene and oligothiophenedibromide, reference Scheme 1. The Suzuki coupling polymerization is generally accomplished by heating with stirring a mixture of equal molar equivalents of (IVb) and arylene-diboronate in a suitable solvent, such as toluene, in the presence of about 2 to about 6 molar percent of tetrakis(triphenylphosphine)-palladum, about 2 to about 4 molar equivalent of an inorganic base, such as sodium carbonate, in the form of a 1 M to 2 M aqueous solution, and about 1 to 5 mole percent of a phase transfer catalyst, such as tetrabutylamomonium chloride or tricaprylylmethylammonium chloride at a temperature of, for example, from about 80° C. to about at about 100° C. under an inert atmosphere. After the polymerization, the polythiophene product, such as (V), is isolated by precipitation from methonol, optionally followed by soxhlet extraction with appropriate solvents such as methanol, toluene, and chlorobenzene.

dielectric layer 54, and the polythiophene semiconductor layer 52, on top of which are deposited a source electrode 60 and a drain electrode 62.

Figure 4:
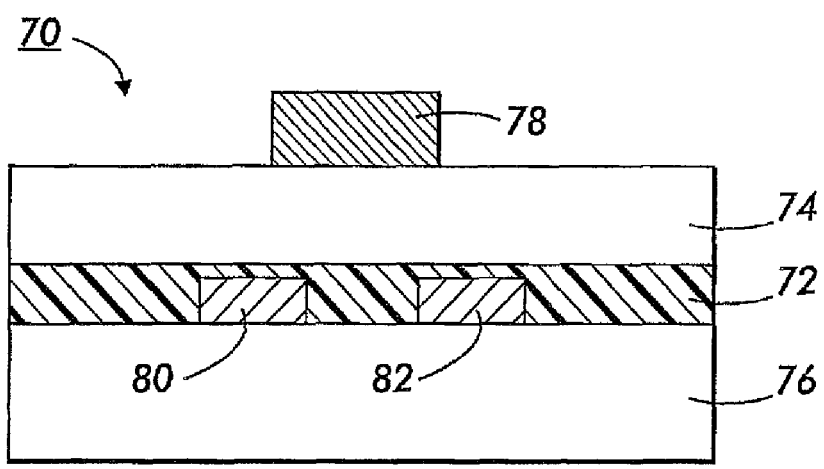

FIG. 4 schematically illustrates an additional TFT configuration 70 comprised of substrate 76, a gate electrode 78, a source electrode 80, a drain electrode 82, the polythiophene semiconductor layer 72, and an insulating dielectric layer 74.

In some embodiments of the present invention, an optional protecting layer, such as a polymer, may be incorporated on top of each of the transistor configurations of FIGS. 1, 2, 3 and 4. For the TFT configuration of FIG. 4, the insulating dielectric layer 74 may also function as a protecting layer.

In embodiments and with further reference to the present invention and the Figures, the substrate layer may generally be a silicon material inclusive of various appropriate forms of silicon, a glass plate, a plastic film or a sheet, and the like depending on the intended applications. For structurally flexible devices, a plastic substrate, such as for example polyester, polycarbonate, polyimide sheets, and the like, may be selected. The thickness of the substrate may be, for example, from about 10 micrometers to over 10 millimeters with a specific thickness being from about 50 to about 100 microme-

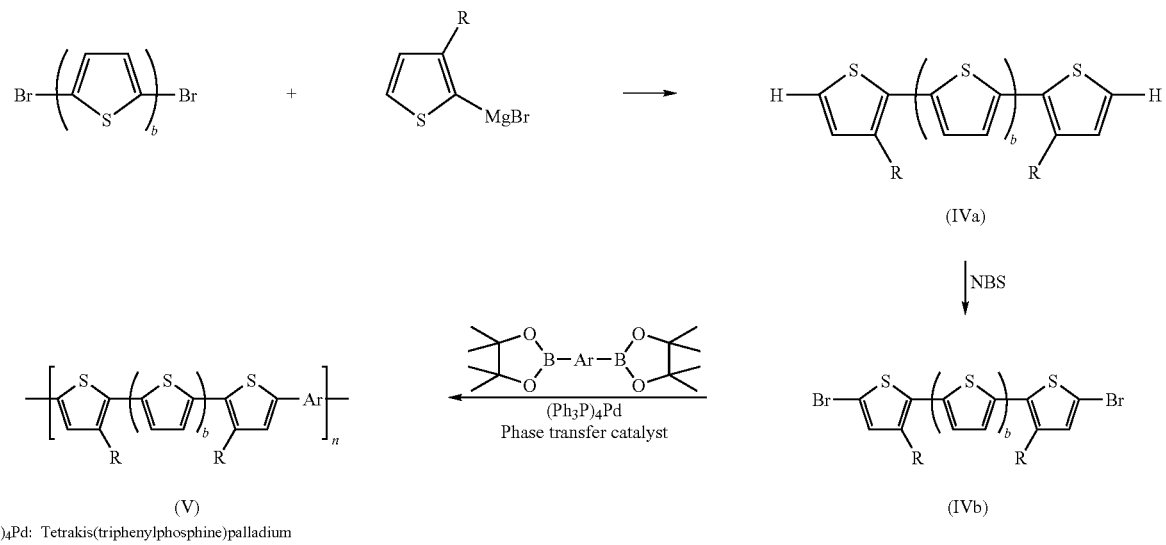

Scheme 1

(V)
(Ph₃P)₄Pd: Tetrakis(triphenylphosphine)palladium

FIGURES

In FIG. 1 there is schematically illustrated a TFT configuration 10 comprised of a substrate 16, in contact therewith a metal contact 18 (gate electrode) and a layer of an insulating dielectric layer 14 on top of which two metal contacts, 20 and 22 (source and drain electrodes), are deposited. Over and between the metal contacts 20 and 22 is the polythiophene semiconductor layer 12 as illustrated herein.

Figure 2:
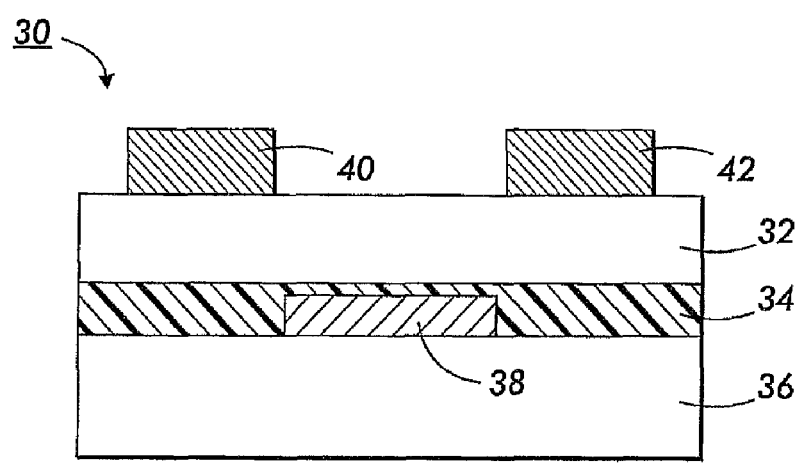

FIG. 2 schematically illustrates a TFT configuration 30 comprised of a substrate 36, a gate electrode 38, a source electrode 40 and a drain electrode 42, an insulating dielectric layer 34, and the polythiophene semiconductor layer 32.

Figure 3:
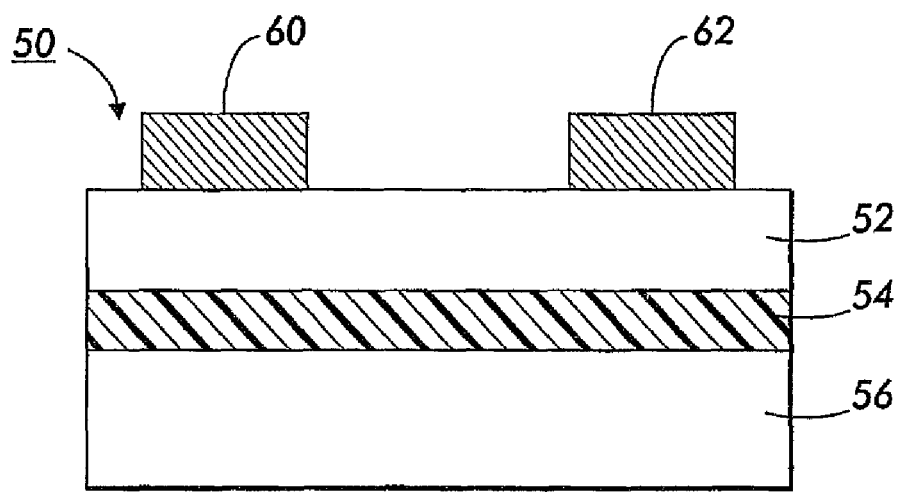

FIG. 3 schematically illustrates another TFT configuration 50 comprised of a heavily n-doped silicon wafer 56 which acts as a gate electrode, a thermally grown silicon oxide ters, especially for a flexible plastic substrate and from about 1 to about 10 millimeters for a rigid substrate such as glass or silicon.

The insulating dielectric layer, which can separate the gate electrode from the source and drain electrodes, and in contact with the semiconductor layer, can generally be an inorganic material film, an organic polymer film, or an organic-inorganic composite film. The thickness of the dielectric layer is, for example, from about 10 nanometers to about 1 micrometer with a more specific thickness being about 100 nanometers to about 500 nanometers. Illustrative examples of inorganic materials suitable as the dielectric layer include silicon oxide, silicon nitride, aluminum oxide, barium titanate, barium zirconate titanate, and the like; illustrative examples of organic polymers for the dielectric layer include polyesters, polycarbonates, poly(vinyl phenol), polyimides, polystyrene, poly(methacrylate)s, poly(acrylate)s, epoxy resin, and the like; and illustrative examples of inorganic-organic composite materials include nanosized metal oxide particles dispersed in polymers such as polyester, polyimide, epoxy resin and the like. The insulating dielectric layer is generally of a thickness of from about 50 nanometers to about 500 nanometers depending on the dielectric constant of the dielectric material used. More specifically, the dielectric material has a dielectric constant of, for example, at least about 3, thus a suitable dielectric thickness of about 300 nanometers can provide a desirable capacitance, for example, of about $10^{-9}$ to about $10^{-7}$ F/cm$^2$.

Situated, for example, between and in contact with the dielectric layer and the source/drain electrodes is the active semiconductor layer comprised of the polythiophenes illustrated herein, and wherein the thickness of this layer is generally, for example, about 10 nanometers to about 1 micrometer, or about 40 to about 100 nanometers. This layer can generally be fabricated by solution processes, such as spin coating, casting, screen, stamp, or jet printing of a solution of the polythiophenes of the present invention.

The gate electrode can be a thin metal film, a conducting polymer film, a conducting film generated from a conducting ink or paste, or the substrate itself (for example heavily doped silicon). Examples of gate electrode materials include but are not limited to aluminum, gold, chromium, indium tin oxide, conducting polymers, such as polystyrene sulfonate-doped poly(3,4-ethylenedioxythiophene) (PSS/PEDOT), a conducting ink/paste comprised of carbon black/graphite or colloidal silver dispersion contained in a polymer binder, such as ELECTRODAG available from Acheson Colloids Company and silver filled electrically conductive thermoplastic ink available from Noelle Industries, or the like. The gate layer can be prepared by vacuum evaporation, sputtering of metals or conductive metal oxides, coating from conducting polymer solutions or conducting inks or dispersions by spin coating, casting or printing. The thickness of the gate electrode layer is, for example, from about 10 nanometers to about 10 micrometers, and a specific thickness is, for example, from about 10 to about 200 nanometers for metal films and about 1 to about 10 micrometers for polymer conductors.

The source and drain electrode layer can be fabricated from materials which provide a low resistance ohmic contact to the semiconductor layer. Typical materials suitable for use as source and drain electrodes include those of the gate electrode materials such as gold, nickel, aluminum, platinum, conducting polymers, and conducting inks. Typical thickness of this layer is about, for example, from about 40 nanometers to about 1 micrometer with the more specific thickness being about 100 to about 400 nanometers. The TFT devices contain a semiconductor channel with a width W and length L. The semiconductor channel width may be, for example, from about 10 micrometers to about 5 millimeters with a specific channel width being about 100 micrometers to about 1 millimeter. The semiconductor channel length may be, for example, from about 1 micrometer to about 1 millimeter with a more specific channel length being from about 5 micrometers to about 100 micrometers.

The source electrode is grounded and a bias voltage of generally about 0 volt to about 80 volts is applied to the drain electrode to collect the charge carriers transported across the semiconductor channel when a voltage of generally about +10 volts to about −80 volts is applied to the gate electrode.

The following Examples are provided.

GENERAL PROCEDURE a) Device Fabrication:

There was selected a top-contact thin film transistor configuration as schematically described by FIG. 3 as the primary test device structure.

The test device was comprised of an n-doped silicon wafer with a thermally grown silicon oxide layer of a thickness of about 110 nanometers thereon. The wafer functioned as the gate electrode while the silicon oxide layer acted as the gate dielectric and had a capacitance of about 32 nF/cm$^2$ (nanofarads/square centimeter). The fabrication of the device was accomplished in ambient conditions without taking any precautions to exclude the materials and device from exposure to ambient oxygen, moisture, or light. The silicon wafer was first cleaned with methanol, air dried, and then immersed in a 0.01 M solution of 1,1,1,3,3,3-hexamethyldisilazane in dichloromethane for 30 minutes at room temperature. Subsequently, the wafer was washed with dichloromethane and dried. The test semiconductor polythiophene layer of about 30 nanometers to about 100 nanometers in thickness was then deposited on top of the silicon oxide dielectric layer by spin coating at a speed of 1,000 rpm for about 35 seconds, and dried in vacuo at 80° C. for 20 hours. The solution used in fabricating the semiconductor layer was comprised of 1 percent by weight of the polythiophene in an appropriate solvent, and was filtered through a 0.45 µm filter before use. Thereafter, the gold source and drain electrodes were deposited on top of the semiconductor polythiophene layer by vacuum deposition through a shadow mask with various channel lengths and widths, thus providing a series of transistors of various dimensions. For consistency, the devices after fabrication were kept in a dry atmosphere of about 30 percent relative humidity in the dark before and after evaluation.

b) TFT Device Characterization:

The evaluation of field-effect transistor performance was accomplished in a black box at ambient conditions using a Keithley 4200 SCS semiconductor characterization system. The carrier mobility, µ, was calculated from the data in the saturated regime (gate voltage, $V_G$<source-drain voltage, $V_{SD}$) accordingly to equation (1)

$$I_{SD}=C_i\mu(W/2L)(V_G-V_T)^2 \tag{1}$$

where $I_{SD}$ is the drain current at the saturated regime, W and L are, respectively, the semiconductor channel width and length, Ci is the capacitance per unit area of the gate dielectric layer, and $V_G$ and $V_T$ are, respectively, the gate voltage and threshold voltage. $V_T$ of the device was determined from the relationship between the square root of $I_{SD}$ at the saturated regime and $V_G$ of the device by extrapolating the measured data to $I_{SD}$=0.

Another property of a field-effect transistor is its current on/off ratio. This is the ratio of the saturation source-drain current when the gate voltage $V_G$ is equal to or greater than the drain voltage $V_D$ to the source-drain current when the gate voltage $V_G$ is zero.

COMPARATIVE EXAMPLE

A series of comparative thin film transistors were fabricated containing the known regioregular polythiophene, poly(3-hexythiophene-2,5-diyl), which is commonly known as P3HT. This material was purchased from Aldrich Chemical and was purified by three successive precipitations of its solution in chlorobenzene from methanol.

The devices were fabricated in ambient conditions in accordance with the procedure as described hereinbefore. Using transistors with a dimension of W (width)=5,000 μm and L (length)=60 μm, the following average properties from at least five transistors were obtained:

| Mobility: | 1 to 1.2 × $10^{-2}$ $cm^2/V \cdot sec$ |
|---|---|
| Initial on-off ratio: | 1.5 to 2.1 × $10^3$ |
| On-off ratio after 5 days: | 5 to 10 |

The observed low initial current on/off ratios are an indication of the propensity of poly(3-hexythiophene-2,5-diyl) towards oxidative doping, that is the instability of poly(3-hexythiophene-2,5-diyl) in the presence of ambient oxygen. The reductions in the current on/off ratios over just a five day period further confirm the functional instability of poly(3-hexythiophene-2,5-diyl) in ambient conditions.

EXAMPLE a) Preparation of Polythiophene (3):

Two monomers, 5,5'-bis(3-dodecyl-5-bromo-2-thienyl)-2,2'-dithiophene and 1,4-benzenebis(pinacolboronate), selected for the preparation of polythiophene (3) were prepared in the following manner.

5,5'-Bis(3-dodecyl-5-bromo-2-thienyl)-2,2'-dithiophene

A solution of 2-bromo-3-dodecylthiophene (11.5 grams, 34.92 mmol) in 40 milliliters of anhydrous tetrahydrofuran (THF) was added slowly over a period of 20 minutes to a mechanically stirred suspension of magnesium turnings (1.26 grams, 51.83 mmol) in 10 milliliters of THF in a 100 milliliter round-bottomed flask under an inert argon atmosphere. The resultant mixture was stirred at room temperature, of about 22° C. to about 25° C., for 2 hours and then at 50° C. for 20 minutes before cooling down to room temperature. The resultant mixture was then added via a cannula to a mixture of 5,5'-dibromo-2,2'-dithiophene (4.5 grams, 13.88 mmol) and [1,3-bis(diphenylphosphino)]dichloronickel (II) (0.189 gram, 0.35 mmol) in 80 milliliters of anhydrous THF in a 250 milliliter round-bottomed flask under an inert atmosphere, and refluxed for 48 hours. Subsequently, the reaction mixture was diluted with 200 milliliters of ethyl acetate, was washed twice with water, with a 5 percent aqueous hydrochloric acid (HCl) solution, and dried with anhydrous sodium sulfate. A dark brown syrup, obtained after evaporation of the solvent, was purified by column chromatography on silica gel, and further purified by recrystallization from a mixture of methanol and isopropanol yielding 5,5'-bis(3-dodecyl-2-thienyl)-2,2'-dithiophene in 55 percent yield; m.p. 58.9° C.

The NMR spectrum of the compound was recorded at room temperature using a Bruker DPX 300 NMR spectrometer:

$^1$H NMR (CDCl$_3$): δ 7.18 (d, J=5.4 Hz, 2H), 7.13 (d, J=3.6 Hz, 2H), 7.02 (d, J=3.6 Hz, 2H), 6.94 (d, J=5.4 Hz, 2H), 2.78 (t, 4H), 1.65 (q, 1.65, 4H), 1.28 (bs, 36H), 0.88 (m, 6H).

To a solution of 5,5'-bis(3-dodecyl-2-thienyl)-2,2'-dithiophene (0.61 gram, 9.22×$10^{-4}$ mmol) in 35 milliliters of 3/1 dichloromethane/acetic acid in a 3-necked flask under an argon atmosphere there was added in small portions solid N-bromosuccinimide (0.348 gram, 1.95×$10^{-3}$ mmol) over a period of 10 to 20 minutes. After 2 hours of reaction, the precipitated solid product was collected by filtration, and recrystallized from a mixture of dichloromethane and methanol. The yield was about 79 percent, m.p., 75.6° C.

$^1$H NMR (CDCl$_3$): δ 6.9 (s, 2H), 7.10 (d, J=3.9 Hz, 2H), 6.96 (d, J=4.2 Hz, 2H), 2.78 (t, 4H), 1.65 (q, 1.65, 4H), 1.28 (bs, 36H), 0.88 (m, 6H).

1,4-Benzenebis(pinacolboronate)

1.7 M of tert-butyllithium in pentane (121 milliliters, 205.7 mmol) was added dropwise by means of a syringe to a solution of 1,4-dibromobenzene (11.9 grams, 50.44 mmol) in 150 milliliters of anhydrous tetrahydrofuran in a 500 milliliter round-bottomed flask at about −75° C. to about −78° C. under an argon atmosphere, and allowed to react for 2 hours. 2-isopropoxy-4,4',5,5'-tetramethyl-1,3,2-dioxaborolane (65.69 grams, 353.08 mmol) was then added quickly by means of a syringe, and the reaction mixture was stirred at the same temperature for an additional 2 hours and then at room temperature for 12 hours. Subsequently, the reaction mixture was diluted with 150 milliliters of dichloromethane, and the solid materials were filtered off. The organic phase was washed 3 times with water, dried, and evaporated to provide the above boronate crude product which was recrystallized from hexane to provide a white solid in about 59 percent yield, m.p., 245.3° C.

$^1$H-NMR(CDCl$_3$): δ 7.8 (s, 4H), 1.3 (s, 24H).

Polymerization:

To a mixture of 5,5'-bis(3-dodecyl-5-bromo-2-thienyl)-2,2'-dithiophene (0.5 gram, 0.61 mmol) and 1,4-benzenebis(pinacolboronate) (0.2 gram, 0.61 mmol) in 5 milliliters of toluene under an argon atmosphere was added a mixture of tetrakis(triphenylphosphine)-palladium (0.014 gram, 0.012 mmol), ALIQUART 336 (0.2 gram) in 2 milliliters of toluene, and 2 M of aqueous sodium carbonate solution (1.5 milliliters). The resultant mixture was heated at reflux with gentle stirring for 2 days. Thereafter, the reaction mixture was poured into methanol and the precipitated polythiophene product was collected by filtration. The polythiophene was purified by soxhlet extration with toluene and then precipitated from methnol to give 0.416 gram of polythiophene (3) as a dark reddish solid.

b) Device Fabrication and Evaluation:

Thin film transistor devices were fabricated under ambient conditions using the above prepared polythiophene according to the general procedures illustrated herein. No precautions were taken to exclude ambient oxygen or light. Using the same dimension as P3HT (W=5,000 μm and L=60 μm), the following average properties from at least five transistors were obtained for PQTP-12.

| Mobility: | 4.3 to 6.1 × $10^{-3}$ $cm^2/V \cdot sec$ |
|---|---|
| Initial on-off ratio: | 6.0 to 9.5 × $10^5$ |
| On-off ratio after 5 days: | 1.8 to 5.5 × $10^5$ |
| On-off ratio after 30 days: | 6.8 to 8.4 × $10^4$ |

The stability of the polythiophene semiconductor layer was demonstrated by the large initial current on/off rations and the slow reduction in current on/off ratio over time.

Other embodiments and modifications of the present invention may occur to those skilled in the art subsequent to a review of the information presented herein; these embodiments and modifications, equivalents thereof, substantial equivalents thereof, or similar equivalents thereof are also included within the scope of this invention.

What is claimed is:

1. A polythiophene wherein the monomer segments thereof consist of:

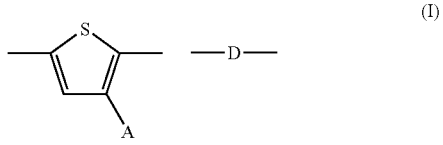

wherein A is a side chain; D is a divalent segment; wherein the number of A-substituted thienylene units (I) in the monomer segments is 2, and the number of divalent segments D is 1.

2. A polythiophene according to claim 1, wherein D is an unsaturated moiety.

3. A polythiophene according to claim 1, wherein D is arylene.

4. A polythiophene according to claim 1, wherein D is heteroaromatic.

5. A polythiophene according to claim 1, wherein D is a heteroaromatic; and A is a long side chain containing 5 to 25 carbon atoms in length.

6. A polythiophene according to claim 1, wherein D is a heteroaromatic, and A is a long side chain containing 5 to 25 carbon atoms.

7. A polythiophene according to claim 1, wherein D is a heteroaromatic, and A is selected from hexyl, heptyl, octyl, nonyl, decyl, undecyl, dodecyl, tridecyl, tetradecyl, and pentyldecyl.

8. A polythiophene according to claim 1, wherein A is alkyl containing from about 5 to about 25 carbon atoms.

9. A polythiophene according to claim 1, wherein A is selected from hexyl, heptyl, octyl, nonyl, decyl, undecyl, dodecyl, tridecyl, tetradecyl, and pentyldecyl.

* * * * *

UNITED STATES PATENT AND TRADEMARK OFFICE
CERTIFICATE OF CORRECTION

PATENT NO. : 7,781,564 B2
APPLICATION NO. : 11/565751
DATED : August 24, 2010
INVENTOR(S) : Beng S. Ong et al.

It is certified that error appears in the above-identified patent and that said Letters Patent is hereby corrected as shown below:

In the Specification:

Column 1, line 24, after "Cooperative Agreement No.", please delete "70NANBOH3033" and insert --70NANB0H3033--.

Signed and Sealed this
Tenth Day of September, 2013

Teresa Stanek Rea
*Acting Director of the United States Patent and Trademark Office*